United States Patent [19]

Williams et al.

[11] Patent Number: 4,958,127
[45] Date of Patent: Sep. 18, 1990

[54] METHOD AND APPARATUS FOR DETERMINING THE STATE OF CHARGE OF A BATTERY

[75] Inventors: Malcolm Williams, West Midlands; Carmichael Mackie; Peter W. Barbour, both of Warwickshire, all of United Kingdom

[73] Assignee: BL Technology Limited, Lighthorne, England

[21] Appl. No.: 870,188

[22] Filed: Jun. 2, 1986

[30] Foreign Application Priority Data

Jun. 19, 1985 [GB] United Kingdom ............... 8515462

[51] Int. Cl.$^5$ ............................................. G01N 27/46
[52] U.S. Cl. ................................... 324/426; 320/48; 324/427; 324/431
[58] Field of Search ............... 324/426, 427, 431, 433, 324/429; 340/636; 320/48

[56] References Cited

U.S. PATENT DOCUMENTS

| | | | |
|---|---|---|---|
| 3,971,980 | 7/1976 | Jungfer et al. | 324/427 X |
| 4,333,149 | 6/1982 | Taylor et al. | 364/481 |
| 4,377,787 | 3/1983 | Kikuoka et al. | 324/426 X |
| 4,390,841 | 6/1983 | Martin et al. | 324/427 |
| 4,433,295 | 2/1984 | Zaugg | 324/429 |
| 4,460,870 | 7/1984 | Finger | 324/429 |
| 4,573,126 | 2/1986 | Lefebvre et al. | 324/426 X |

FOREIGN PATENT DOCUMENTS

| | | |
|---|---|---|
| 0003917 | 9/1979 | European Pat. Off. |
| 8302005 | 6/1983 | PCT Int'l Appl. |
| 1554011 | 10/1979 | United Kingdom |
| 2121971 | 6/1983 | United Kingdom |

Primary Examiner—Reinhard J. Eisenzopf
Assistant Examiner—Robert W. Mueller
Attorney, Agent, or Firm—Thomas J. Greer, Jr.

[57] ABSTRACT

A method of determining the state of charge of a motor vehicle battery 1 in which a stabilization load 2 is applied to the battery 1 after the engine is switched off to accelerate the stabilization of the charge distribution within the battery 1. The stabilization load 2 is applied until the terminal voltage of the battery 1 reaches a level corresponding to a predicted value of the state of charge of the battery 1. After a pre-determined delay of 8 hours or less, the terminal voltage of the battery 1 is measured and the state of charge derived therefrom.

20 Claims, 4 Drawing Sheets

METHOD AND APPARATUS FOR DETERMINING THE STATE OF CHARGE OF A BATTERY

This invention relates to a method and apparatus for determining the state of charge of a battery and, in particular, the battery of a motor vehicle.

A well known technique used in warehouses and garages for determining the state of charge of a battery involves the measurement of the open circuit terminal voltage of the battery after it has been stored for some time. The storage time is essential to allow any transient variation of charge distribution within the battery following charging or discharging thereof to stabilize and it is found that storage times of 30 hours or more are needed to obtain a reasonably accurate determination of the state of charge using this technique. Having measured the open circuit terminal voltage, a value for the state of charge is obtained from appropriate conversion tables. This technique is not able to provide an accurate determination of the state of charge soon after the battery has been subject to a charging or discharging current and is therefore unsuitable for use in determining the state of charge of a battery used in a motor vehicle which is rarely left idle for periods greater than 15 hours.

According to a first aspect of this invention there is provided a method of determining the state of charge of a battery comprising the steps of: applying a load to the battery to accelerate stabilization of the charge distribution therein after any charging or discharging current passing through the battery has fallen below a given level; measuring the terminal voltage of the battery after the said load has been removed; and evaluating the state of charge from stored data on the relationship between the terminal voltage and the state of charge of the battery.

According to a second aspect of this invention there is provided apparatus for determining the state of charge of a battery comprising: stabilization means arranged to apply a load to the battery to accelerate stabilization of the charge distribution therein after any charging or discharging current passing through the battery has fallen below a given level; measuring means arranged to measure the terminal voltage of the battery after the said load has been removed; and evaluating means arranged to evaluate the state of charge from stored data on the relationship between the terminal voltage and the state of charge of the battery.

Preferred features and uses of this invention will be apparent from the subsidiary claims of the specification.

This invention will now be described, merely by way of example, with reference to the accompanying drawings, in which.

In the embodiment of the invention to be described, a stabilization load is applied to the battery being tested after any charging or discharging current flowing therethrough has fallen below a given level, this load acting to accelerate stabilization of the charge distribution in the battery and thus enabling an accurate determination of the state of charge of the battery to be effected sooner than would otherwise have been possible. The stabilization load may, typically, be applied for a period of 2 to 5 minutes and the state of charge determined after a further settling time of 8 hours or less.

The embodiments described relate to a battery of a motor vehicle and in this situation it is convenient if the stabilization load is applied to the battery when the engine of the motor vehicle is switched off and any relatively large loads on the battery, e.g. those due to lights and heating devices, are removed. This may be achieved by sensing when the engine is switched off and checking that any remaining discharge current is less than a value such as 50 mA. The relatively small, permanent loads such as those due to electronic clocks and electronic management systems, which cannot be switched off unless the battery is disconnected have little effect upon the method.

Figure 1:
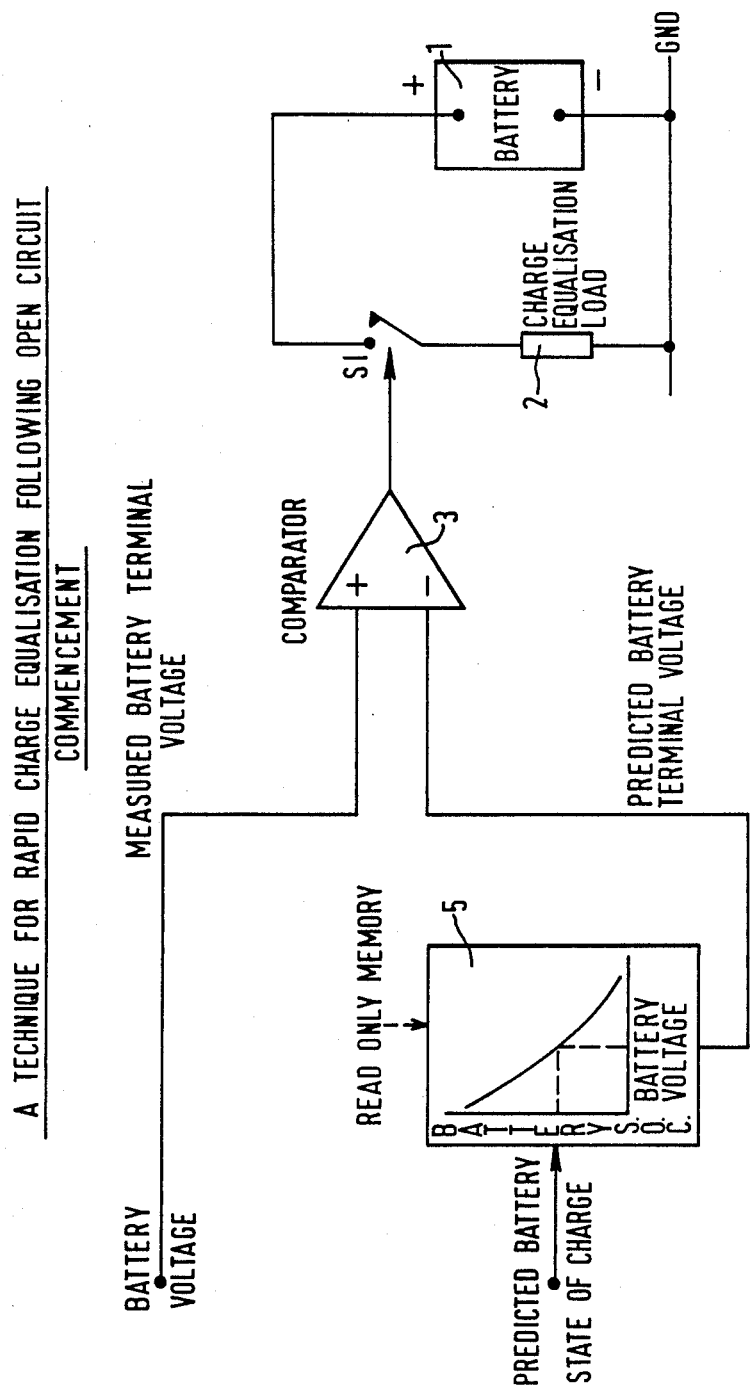
FIG. 1 is a schematic diagram of an arrangement for applying a stabilization load to a battery as used in a preferred embodiment of this invention.

FIG. 1 illustrates a method of applying a stabilization load to a battery 1. The battery 1 to be tested may be connected to a stabilization load 2 by means of a switch S1. The switch S1 is controlled by a comparator 3 which receives as a first input a measurement of the terminal voltage of the battery 1 and a second input from a ROM 5 connected to receive a predicted, digitised value of the state of charge of the battery 1 and to convert this into a corresponding voltage in accordance with stored data on the relationship between the terminal voltage and the state of charge of the battery. When the engine is switched off, the switch S1 is arranged to be closed by means not shown and is kept closed for a period determined by the comparator 3. In the illustrated arrangement, the load 2 is connected to the battery 1 until the terminal voltage thereof reaches a level corresponding to the predicted state of charge of the battery whereupon the output of the comparator 3 inverts and opens switch S1. The terminal voltage of the battery 1 is thus rapidly brought from a transient level imposed by earlier charging or discharging to a level corresponding to its predicted state of charge as the applied load accelerates the stabilization of charge distribution in the battery although further settling of the charge distribution will continue after application of the stabilization load. The prediction of a value for the state of charge of the battery will be described in detail below with reference to FIG. 4.

Figure 2:
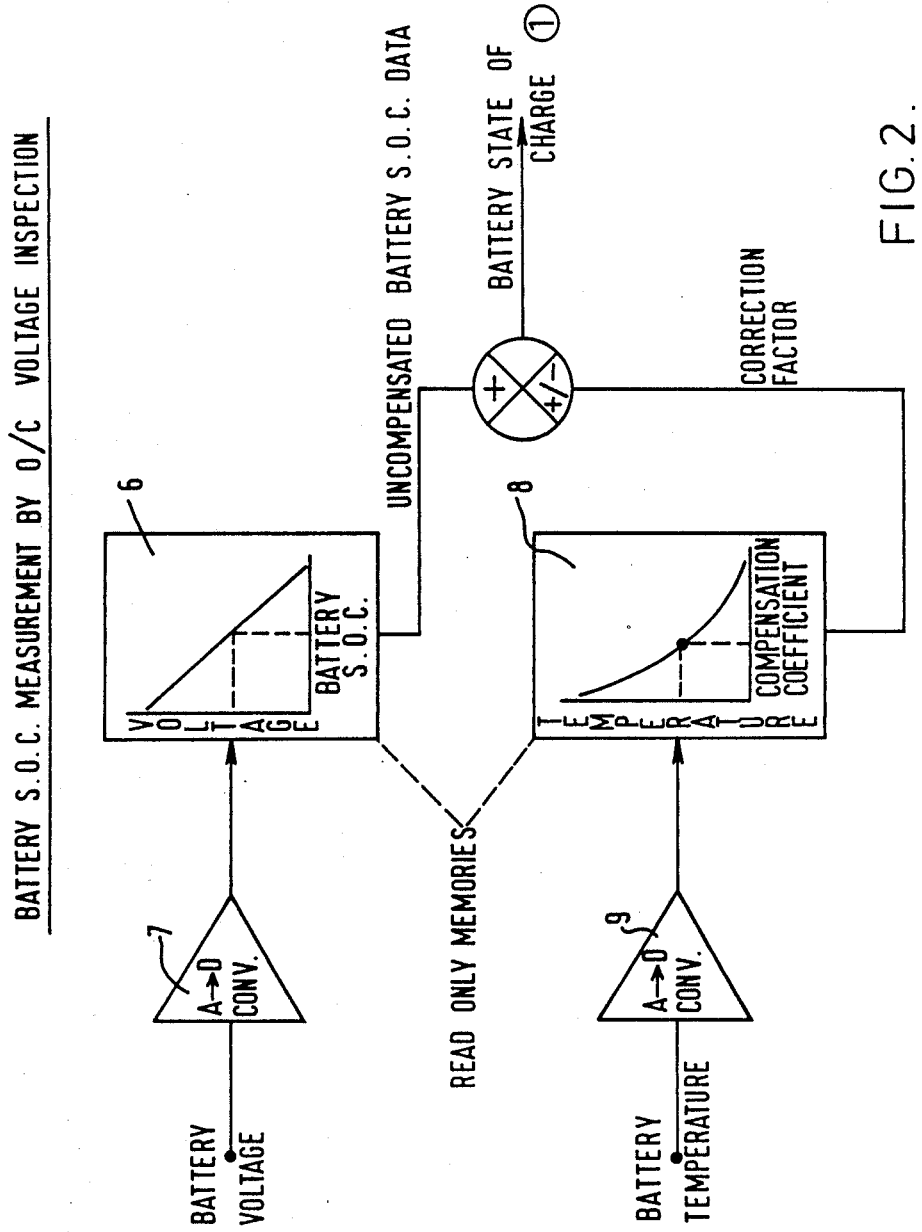
FIG. 2 is a schematic diagram of an arrangement for evaluating the state of charge of the battery as used in a preferred embodiment of this invention.

Once the charge distribution in the battery has stabilized to a sufficient degree by means of application of the stabilization load, a further pre-determined settling period is allowed before the state of charge of the battery is deteremined. This period, which may be as short as 2 hours, may be measured by any suitable timing device. FIG. 2 illustrates a first method of determining the state of charge of the battery after this settling period. In this method, the terminal voltage of the battery is measured when it is on open circuit or is subject only to relatively small, permanent loads. A ROM 6 is connected to receive a measurement of the terminal voltage of the battery from an analog to digital convertor 7 and is arranged to provide an uncompensated signal for the state of charge of the battery in accordance with stored data on the direct relationship between the terminal voltage and the state of charge of the battery. As this relationship is temperature dependent, this signal is subject to a correction factor provided by a ROM 8 which is connected to receive a measurement of the battery temperature from an analog to digital convertor 9, the ROM 8 converting the temperature signal into a correction factor in accordance with stored data on the relationships between terminal voltage, temperature and state of charge of the battery. The outputs of the ROMs 6 and 8 are combined to produce a measurement of the state of charge of the battery. The battery temperature is measured by any suitable device such as a thermistor (not shown).

Figure 3:
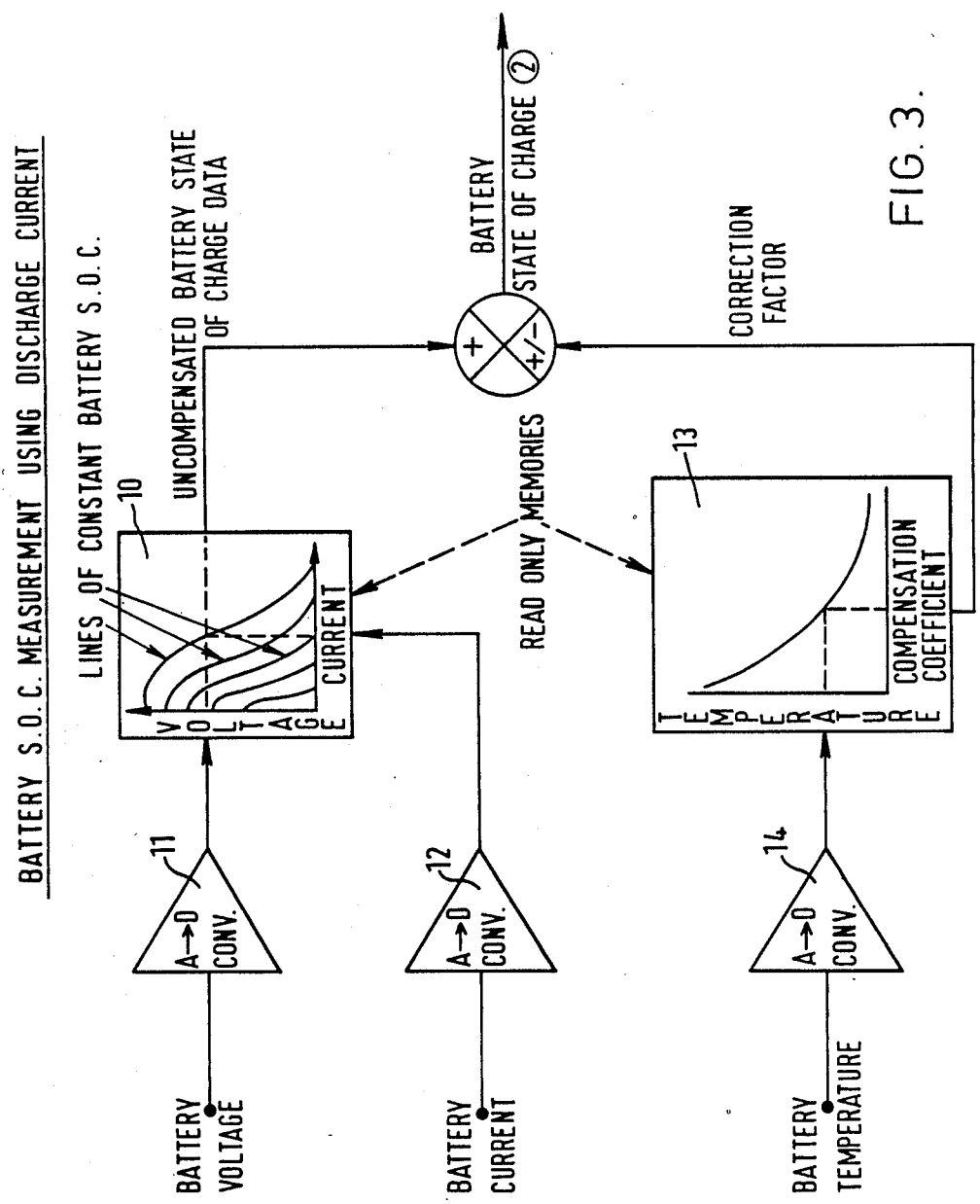
FIG. 3 is a schematic diagram of an alternative arrangement for evaluating the state of charge of the battery.

FIG. 3 illustrates an alternative method of determining the state of charge of the battery after the settling period. In this method, the terminal voltage of the battery is measured whilst a known current is drawn therefrom. A ROM 10 is connected to receive a measurement of the terminal voltage and of the current drawn from the battery from analog to digitial convertors 11 and 12 and is arranged to provide an uncompensated measurement of the state of charge of the battery in accordance with stored data on the relationships between terminal voltage, drawn current and state of charge of the battery. These relationships are also temperature dependent and are therefore subject to a correction factor provided by a ROM 13 which is connected to receive a measurement of the battery temperative via an analog to digital convertor 14, the ROM 13 converting the temperature measurement into a correction factor in accordance with stored data on the relationships between terminal voltage, drawn current, temperature and state of charge of the battery. The outputs of the two ROMs 10 and 13 are combined to produce a measurement of the state of charge of the battery. The current drawn from the battery is measured by the voltage across a resistor (not shown) in series with the battery making allowance, if necessary, for any small, permanent loads on the battery.

Figure 4:
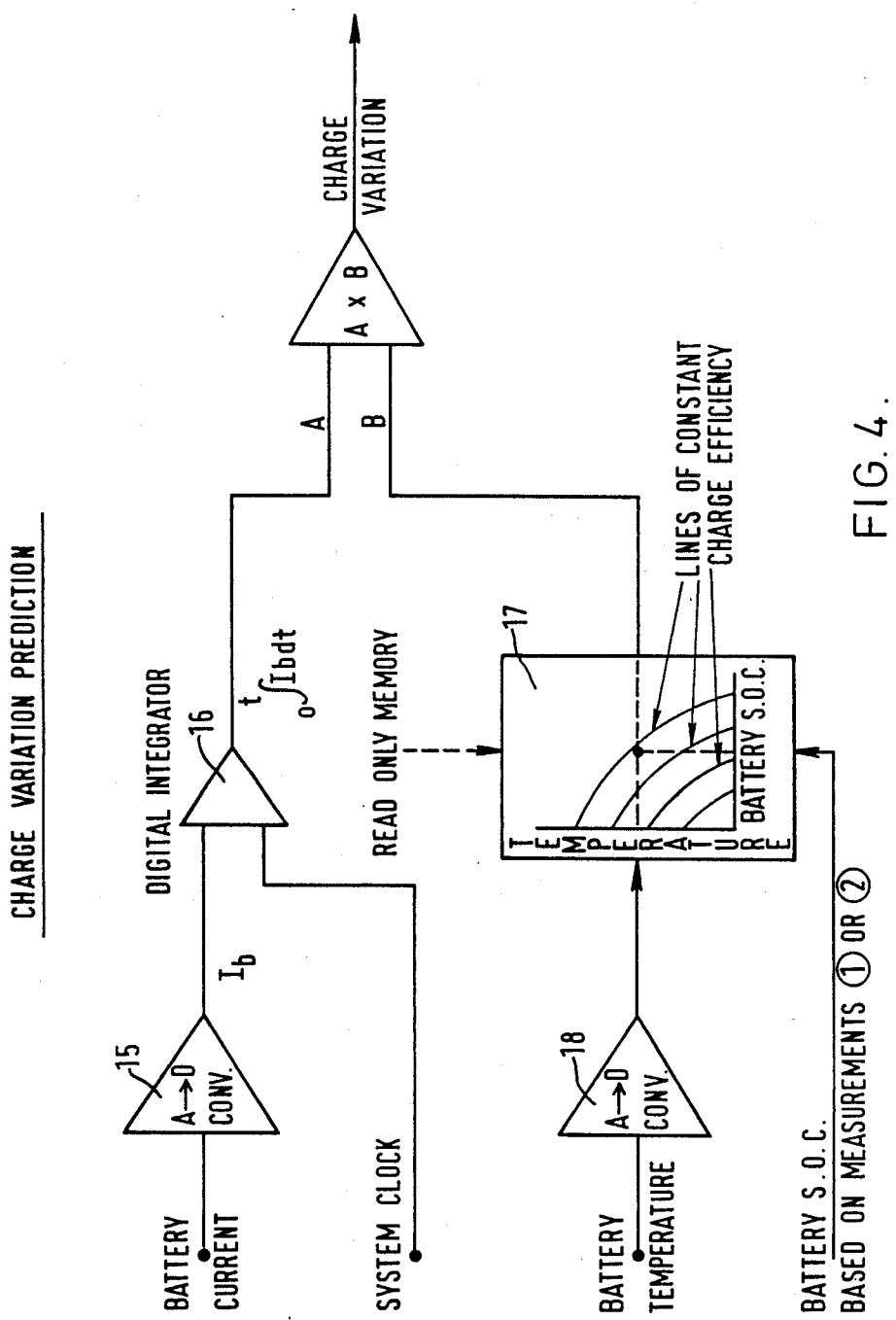
FIG. 4 is a schematic diagram of an arrangement for providing a predicted value of the state of charge of the battery as used in a preferred embodiment of this invention.

A method of providing a predicted value for the state of charge of the battery is illustrated in FIG. 4. In this method, the current flowing through the battery whilst it is being charged and discharged is measured with respect to time to provide an estimate of the variation of the state of charge of the battery since the previous determination thereof and thus to provide a predicted value for the state of charge of the battery. The current flowing through the battery is measured by the voltage across a resistor (not shown) in series with the battery and this measurement is provided via an analog to digital convertor 15 to a digital integrator 16 which integrates the current with respect to time to provide an approximate amp-hour signal A. As the charge efficiency of a battery is temperature dependent, the accuracy of the prediction can be improved by applying a correction factor B determined by a ROM 17 which is connected to receive a measurement of battery temperature from an analog to digital convertor 18 and to receive a signal based on the previous measurement of the state of charge of the battery. The ROM 17 is arranged to convert the measurements of temperature and previous state of charge into a correction factor in accordance with stored data on the relationships between charge efficiency, temperature and state of charge of the battery. The signals A and B are combined to provide an estimate of the variation of the state of charge of the battery since the last determination thereof from which a predicted value of the state of charge can be derived. This predicted value is used to control the duration of the stabilization load applied to the battery as described in relation to FIG. 1.

The described apparatus may conveniently be in the form of a microprocessor connected to sensors measuring the various parameters required.

The methods and apparatus described above enable a reasonably accurate determination of the state of charge of the battery to be provided relatively soon after any charging or discharging current passing through the battery has fallen below the given level and it is therefore feasible for a determination of the state of charge of a battery of a motor vehicle to be accurately updated when the vehicle is left idle over night. The vehicle can therefore be provided with an indicator for providing the driver with an indication of the last determination of the state of charge of the battery and thus provide a warning if the battery is not sufficiently charged to start the engine. When the car is being used, and the battery thus subject to charging and discharging currents, the described apparatus monitors the current to provide an on-going prediction of the state of charge of the battery. This on-going prediction may, if desired, also be indicated to the driver although it is to be understood that it is merely an estimation which is used, as described above, to determine the duration of the application of the stabilization load when the state of charge is next determined after the engine is switched off and major loads on the battery removed.

The stabilization load applied to the battery may be approximately 10 amps and, as mentioned above, may have a duration of between 2 and 5 minutes. In order to accomodate a situation in which a fault occurs which prevents the terminal voltage of the battery from reaching a level corresponding to the predicted state of charge, an upper limit of about 10 minutes is preferably applied to the duration of the stabilization load.

The various relationships between terminal voltage, temperature, state of charge, etc. described above may differ for different types of battery so the apparatus described is preferably provided with a plurality of sets of data appropriate to the more common types of battery. The selection of the appropriate data set for the battery being tested may be determined by a manual adjustment of the apparatus, or alternatively, may be sensed automatically by determining the characteristics of the battery being tested by measurements of its terminal voltage and of current drawn therefrom.

It may also be advantageous for a motor vehicle to be provided with apparatus for determining the state of charge of the battery using both of the methods described in relation to FIGS. 2 and 3 since circumstances may arise in which one or other of these methods provides a more accurate or speedier measurement of the state of charge. The selection of the method to be used in any particular circumstance can be governed by a microprocessor in accordance with knowledge of the battery's immediate history.

The determination of the state of charge of the battery may also be used to control the charging of the battery by substantially reducing or switching off the charging current when the state of charge reaches a pre-determined level. Thermal runaway of the battery can thereby be prevented.

We claim:

1. A method of determining the state of charge of a battery which is subjected to repeated cycles of partial charge and discharge including the steps of (1) selecting a quiescent interval during which substantially no charging or discharging current flows through the battery (2) applying for a short period of time, during said quiescent interval, a specific pre-determined load to the battery to produce a desired discharging current flow through the battery to accelerate stabilization of the charge distribution in the battery (3) removing said load to thereby allow stabilization of the charge distribution in the battery to continue for a predetermined time delay of at least two hours and (4) measuring the terminal voltage of the battery after said time delay and evaluating the state of charge of the battery by comparing the measured voltage with known data on the relationship between the terminal voltage and the state of charge of the battery.

2. A method as claimed in claim 1 in which during the quiescent interval the charging or discharging current flow through the battery is less than 50 mA.

3. A method as claimed in claim 2 in which the specific pre-determined load applied to the battery produces a discharge current through the battery of approximately 10 amps.

4. A method as claimed in claim 3 in which the predetermined time delay is less than 8 hours.

5. A method as claimed in claim 3 in which the short period of time is such that the terminal voltage of the battery is brought to a level substantially corresponding to a predicted value of the state of charge of the battery.

6. A method as claimed in claim 2 in which the predetermined time delay is less than 8 hours.

7. A method as claimed in claim 2 in which the short period of time is such that the terminal voltage of the battery is brought to a level substantially corresponding to a predicted value of the state of charge of the battery.

8. A method as claimed in claim 1 in which the specific pre-determined load applied to the battery produces a discharge current through the battery of approximately 10 amps.

9. A method as claimed in claim 8 in which the predetermined time delay is less than 8 hours.

10. A method as claimed in claim 1 in which the predetermined time delay is less than 8 hours.

11. A method as claimed in claim 1 in which the short period of time is such that the terminal voltage of the battery is brought to a level substantially corresponding to a predicted value of the state of charge of the battery.

12. A method as claimed in claim 1 in which the temperature of the battery is measured and the predicted value of the state of charge of the battery is determined in accordance with stored data on the relationship between temperature and the terminal voltage of the battery.

13. A method as claimed in claim 1 in which the short period of time is between 2 and 5 minutes.

14. A method of providing a predicted value of the state of charge for a battery while it is being subjected to repeated cycles of partial charge and discharge comprising the steps of: (1) determining the state of charge of the battery including the steps of (a) selecting a quiescent interval during which substantially no charging or discharging current flows through the battery (b) applying for a short period of time, during said quiescent interval, a specific pre-determined load to the battery to produce a desired discharging current flow through the battery to accelerate stabilization of the charge distribution in the battery (c) removing said load to thereby allow stabilization of the charge distribution in the battery to continue for a pre-determined time delay of at least two hours and (d) measuring the terminal voltage of the battery after said time delay and evaluating the state of charge of the battery by comparing the measured voltage with known data on the relationship between the terminal voltage and the state of charge of the battery; (2) measuring the current flow through a resistor arranged in series with the battery during charging or discharging of the battery; (3) integrating the current flow through the resistor to provide an approximate measurement of amp-hour flow and combining the amp-hour measurement with said previously determined state of charge to provide a predicted value of the state of charge at that point in time.

15. A method as claimed in claim 14 in which the temperature of the battery is measured and the predicted value of the state of charge of the battery is modified in accordance with stored data on the relationship between temperature and the charge efficiency of the battery.

16. A method of controlling the charging of a battery in which the charging current is substantially reduced or switched off when the predicted state of charge, as determined in accordance with claim 14, reaches a predetermined level thereby preventing thermal run away of the battery.

17. A method of controlling the charging of a battery in which the charging current is substantially reduced or switched off when the predicted state of charge, as determined in accordance with claim 14, reaches a predetermined level thereby preventing thermal run away of the battery.

18. Apparatus for determining the state of charge of a battery which is subjected to repeated cycles of partial charge and discharge during a quiescent interval during which substantially no charging or discharging current flows through the battery including: stabilization means for applying for a short period of time a specific pre-determined load to the battery to accelerate stabilization of the charge distribution therein, measuring means for providing a measurement of the terminal voltage of the battery after a pre-determined time delay from when the specific pre-determined load is removed, and evaluating means for comparing the measurement of the terminal voltage of the battery from the measuring means with data stored in a memory device relating the terminal voltage of the battery to the state of charge of the battery.

19. Apparatus as claimed in claim 18 in which the apparatus further includes, temperature sensing means for sensing the temperature of the battery and to provide a signal indicative of the sensed temperature to the evaluating means for use as a temperature compensation signal.

20. Apparatus as claimed in claim 19 in which the evaluating means includes a memory device storing data relating to the state of charge of the battery to the temperature thereof to which the temperature compensation signal is supplied, the arrangement being such that the evaluating means evaulates the state of charge of the battery with reference to the stored data relating the terminal voltage of the battery to the state of charge of the battery to the temperature of the battery thereby providing a temperature compensated value of state of charge of the battery.

* * * * *